(12) United States Patent
Ho et al.

(10) Patent No.: US 8,288,279 B1
(45) Date of Patent: Oct. 16, 2012

(54) METHOD FOR FORMING CONDUCTIVE CONTACT

(75) Inventors: Jar-Ming Ho, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/162,537

(22) Filed: Jun. 16, 2011

(51) Int. Cl.
*H01L 21/44* (2006.01)
*H01L 21/336* (2006.01)
(52) U.S. Cl. .............. 438/674; 438/300; 257/E21.062
(58) Field of Classification Search .......... 438/300, 438/597, 637–647, 657, 666–675; 257/E21.046, 257/E21.06–E21.062, E21.385, E21.42
See application file for complete search history.

Primary Examiner — Charles Garber
Assistant Examiner — Calvin Choi

(57) ABSTRACT

A method for fabricating a conductive contact is provided, including: providing a semiconductor substrate with a gate structure and a pair of first conductive regions in a first region, and a pair of second conductive regions and an isolation element in the second region, and a first dielectric layer and a second dielectric layer thereon; forming a third dielectric layer and a fourth dielectric layer over the semiconductor substrate in the first region; forming a pattern mask layer with a first opening over the second dielectric layer in the second region; performing an etching process to the third and fourth dielectric layers in the first region and a portion of the first and second dielectric layers in the second region exposed by the first opening; removing the patterned mask layer; forming a first conductive semiconductor layer over the first conductive regions and a second conductive semiconductor layer over the isolation element and portions of the top surface of the second conductive regions; forming a fifth dielectric layer over the semiconductor substrate; forming a third opening in the fifth dielectric layer in the second region; and forming a conductive layer in the third opening.

10 Claims, 12 Drawing Sheets

METHOD FOR FORMING CONDUCTIVE CONTACT

BACKGROUND OF THE INVENTION

1. Field of the Invention

The present invention relates to a method for fabricating a semiconductor structure, and more particularly to a method for fabricating a conductive contact with reduced contact resistances.

2. Description of the Related Art

Recently, along with progressive micro-sizing of semiconductor devices, degree of integration has also increased. Accordingly, the dimensions of the diameters of conductive contacts of semiconductor devices have been reduced.

Thus, the fabrication technique for forming a conductive contact in the interlayer insulating film between a conductive region of a semiconductor substrate and an upper wiring level layer over the interlayer insulating film is one of the most important fabrication techniques for semiconductor fabrication today. As the degree of density of integration of integrated circuit devices increases, contact resistances of the conductive contacts formed in the insulating layer is further increased along with the reduction of the dimensions of the diameters of conductive contacts.

Thus, it is necessary to develop a method for fabricating a conductive contact with reduced contact resistances for semiconductor devices of further reduced-sizes.

BRIEF SUMMARY OF THE INVENTION

An exemplary method for fabricating a conductive contact comprises: providing a semiconductor substrate with a gate structure formed thereover and a pair of first conductive regions formed therein in a first region thereof, and a pair of second conductive regions and an isolation element formed therein, and a first dielectric layer and a second dielectric layer thereon in a second region thereof, wherein the pair of first conductive regions are formed in the semiconductor substrate from opposite sides of the gate structure and the isolation element isolates the pair of the second conductive regions from each other; conformably and sequentially forming a third dielectric layer and a fourth dielectric layer over the semiconductor substrate in the first region; forming a pattern mask layer with a first opening therein over the second dielectric layer in the second region, wherein the first opening is substantially located over the isolation element; performing an etching process to etch back the third and fourth dielectric layers in the first region and a portion of the first and second dielectric layers in the second region exposed by the opening in the patterned mask layer, thereby forming a composite spacer on opposite sidewalls of the gate structure in the first region and a second opening in the first and second dielectric layers in the second region, wherein the second opening formed in the first and second dielectric layers exposes a portion of a top surface of the isolation element and portions of a top surface of the pair of second conductive regions; removing the patterned mask layer; performing an epitaxy process and forming a first conductive semiconductor layer over the pair of the first conductive regions and a second conductive semiconductor layer over the top surface of the isolation element and portions of the top surface of the pair of second conductive regions exposed by the second opening; blanketly forming a fifth dielectric layer over the semiconductor substrate in the first and second regions; forming a third opening in the fifth dielectric layer in the second region, exposing a top surface of the second conductive semiconductor; and forming a conductive layer in the third opening, overlying the second conductive semiconductor layer and filling the fifth opening.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
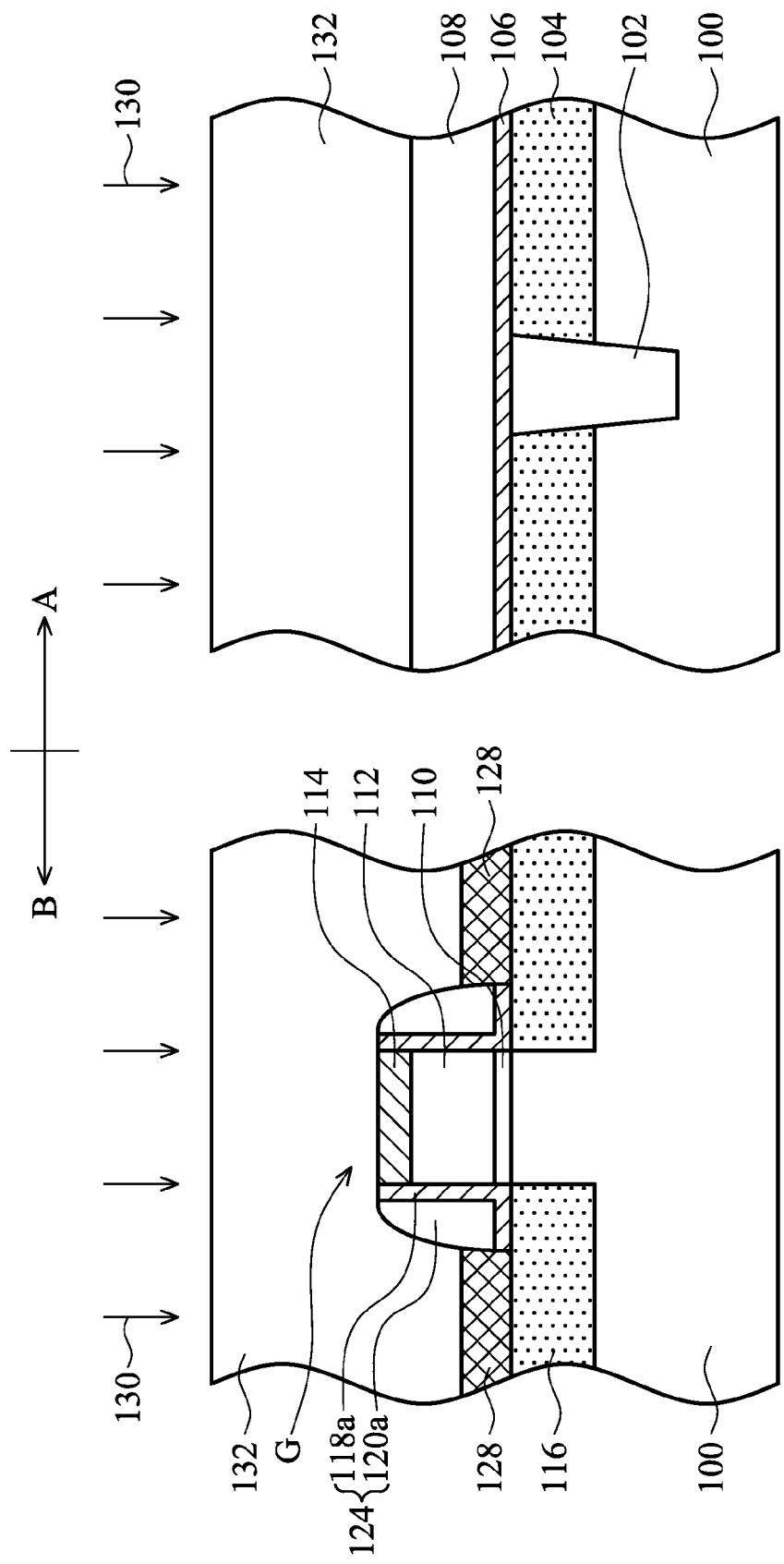
Figure 5:
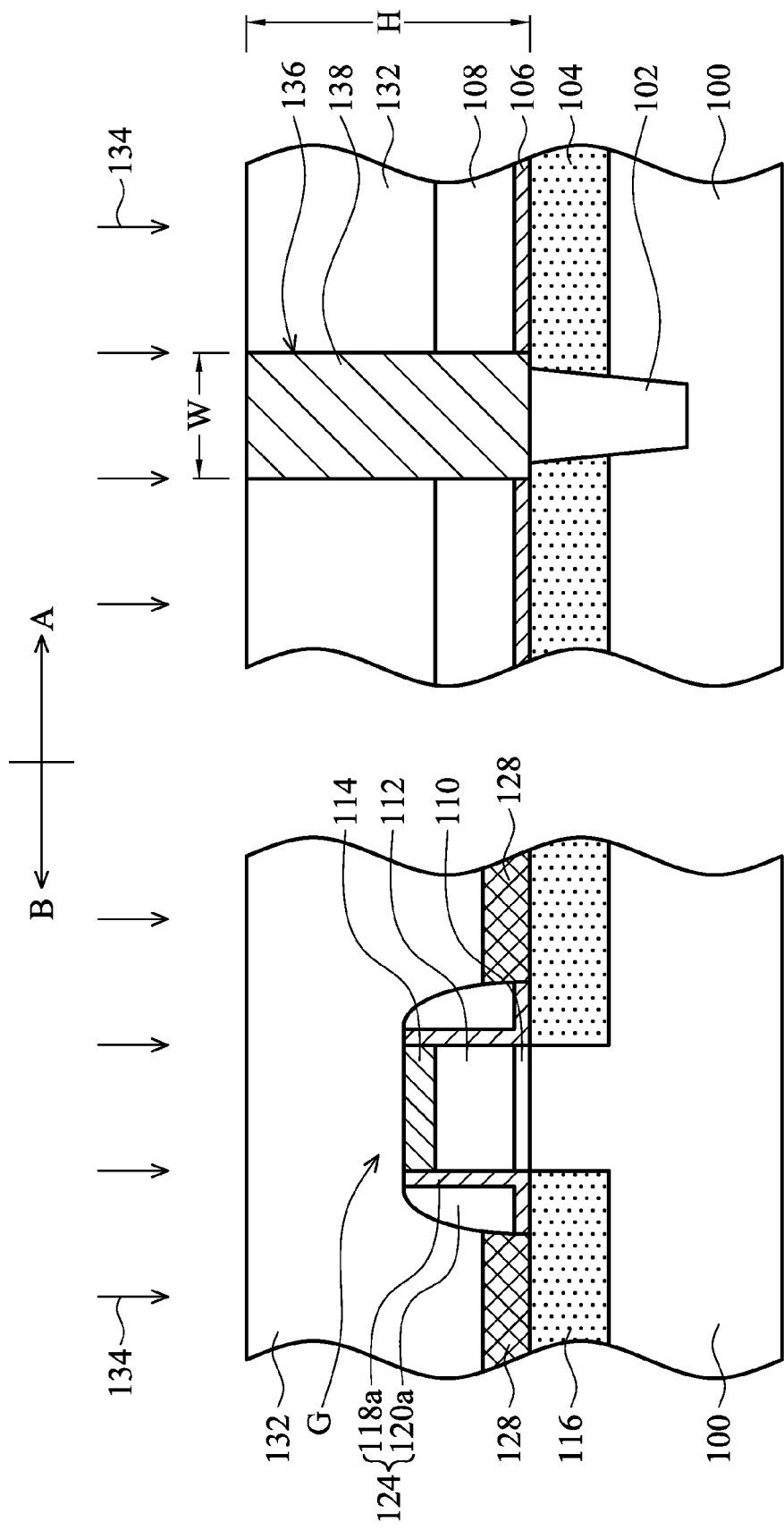
Figure 6:
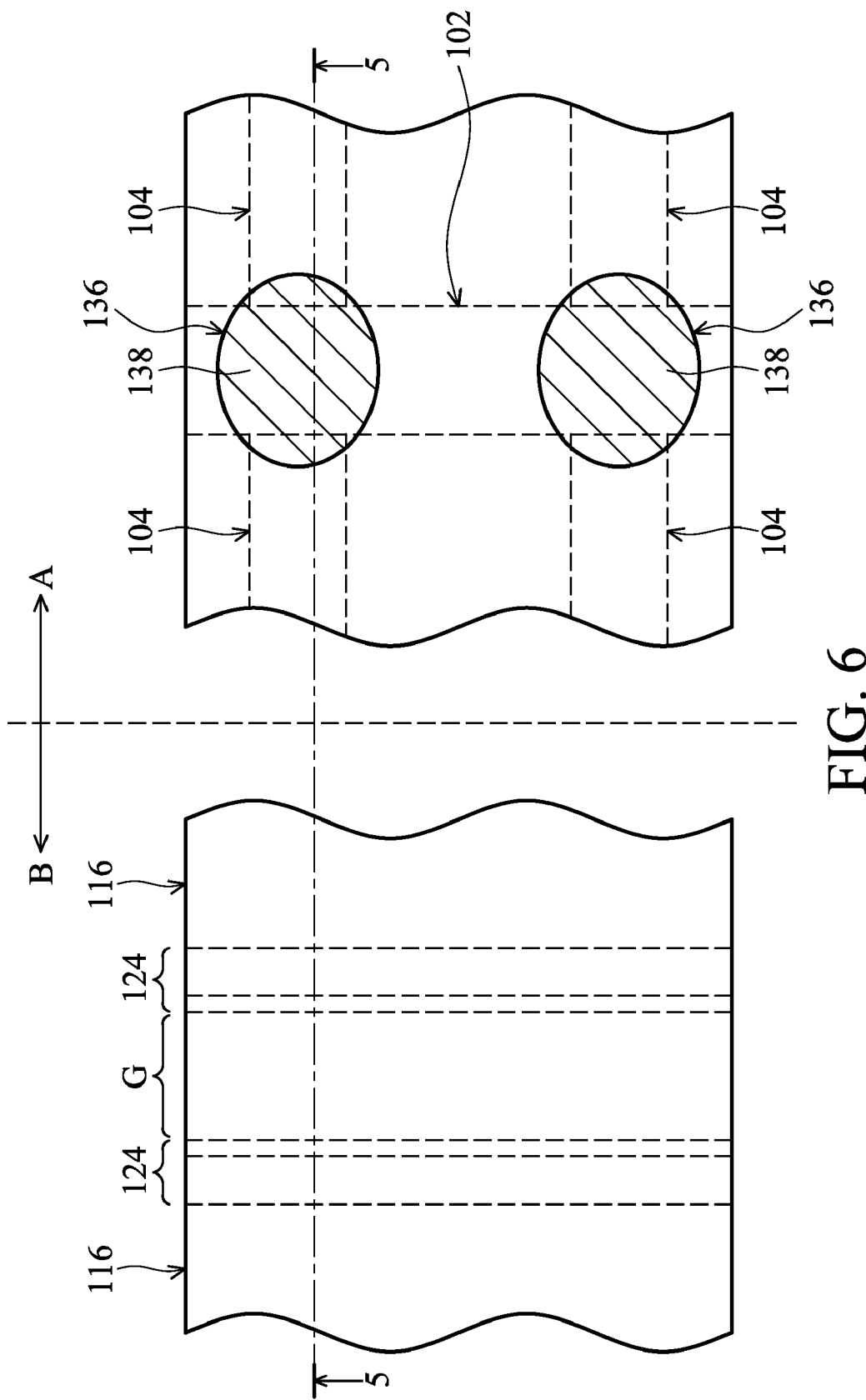

FIGS. 1-6 are schematic diagrams showing an exemplary method for fabricating a conductive contact, wherein FIGS. 1-5 show schematic cross sections and FIG. 6 shows a schematic top view of the method. Herein, the exemplary method is a method known by the inventors and is used as a comparative example to comment on the problems found by the inventors, but is not used to restrict the scope of the invention.

Figure 1:
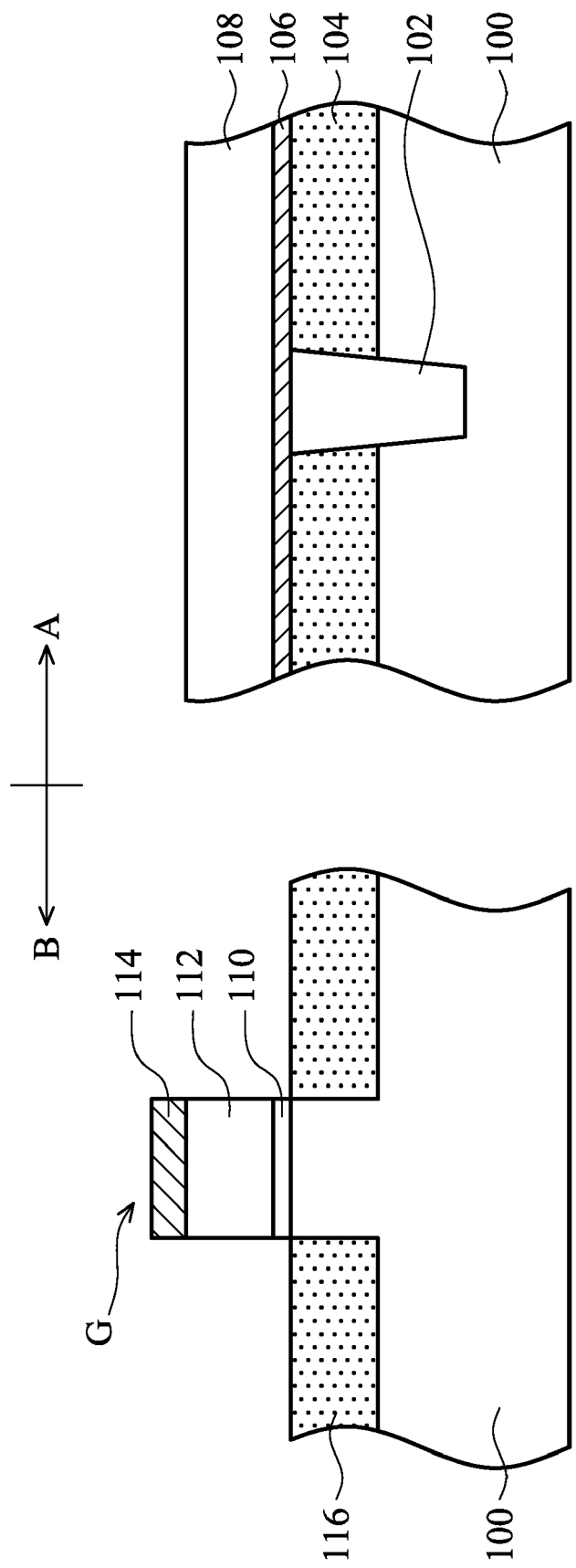
FIGS. 1-6 are schematic diagrams showing a method for fabricating a conductive contact according to an embodiment of the invention.

In FIG. 1, a semiconductor substrate 100 such as a p-type silicon substrate is first provided. As shown in FIG. 1, two individual regions A and B are defined over the semiconductor substrate 100 to accommodate various devices (not shown). In one embodiment, the region A may function as an array region for accommodating memory cells of a memory device (not shown) and the region B may function as a periphery region for accommodating periphery circuits of a memory device (not shown). The semiconductor substrate 100 in the region A is provided with a plurality of conductive regions 104 and an isolation element 102 therein, and two dielectric layers 106 and 108 sequentially formed thereover. The semiconductor substrate 100 in the region B is provided with a gate structure G thereover and two conductive regions 116 formed therein, and the conductive regions 116 are adjacent to opposite sides of the gate structure G. In one embodiment, the isolation element 102 in the region A is a shallow trench isolation (STI) but is not limited thereto. The isolation element 102 isolates the conductive regions 104 from each other. In one embodiment, the conductive regions 104 can be, for example, n-type doped regions which may both function as source or drain regions of a transistor (not shown) for a memory cell of a memory device such as a dynamic random access memory (DRAM) device. The dielectric layer 106 may comprise silicon oxide and has a thickness of about 1000-2000 Å, and the dielectric layer 108 may comprise silicon nitride and has a thickness of about 100-500 Å. The gate structure G may comprise a gate dielectric layer 110, a gate electrode 112, and a mask layer 114 sequentially formed over the semiconductor substrate 100, and the conductive regions 116 formed in the semiconductor substrate 100 in the region B can be, for example, n-type doped regions which may function as source/drain regions. In one embodiment, the gate dielectric layer 110 may comprise silicon oxide or high-k dielectrics, the gate electrode 112 may comprise doped polysilicon, metal, or combinations thereof, and the mask layer 114 may comprise silicon nitride.

Figure 2:
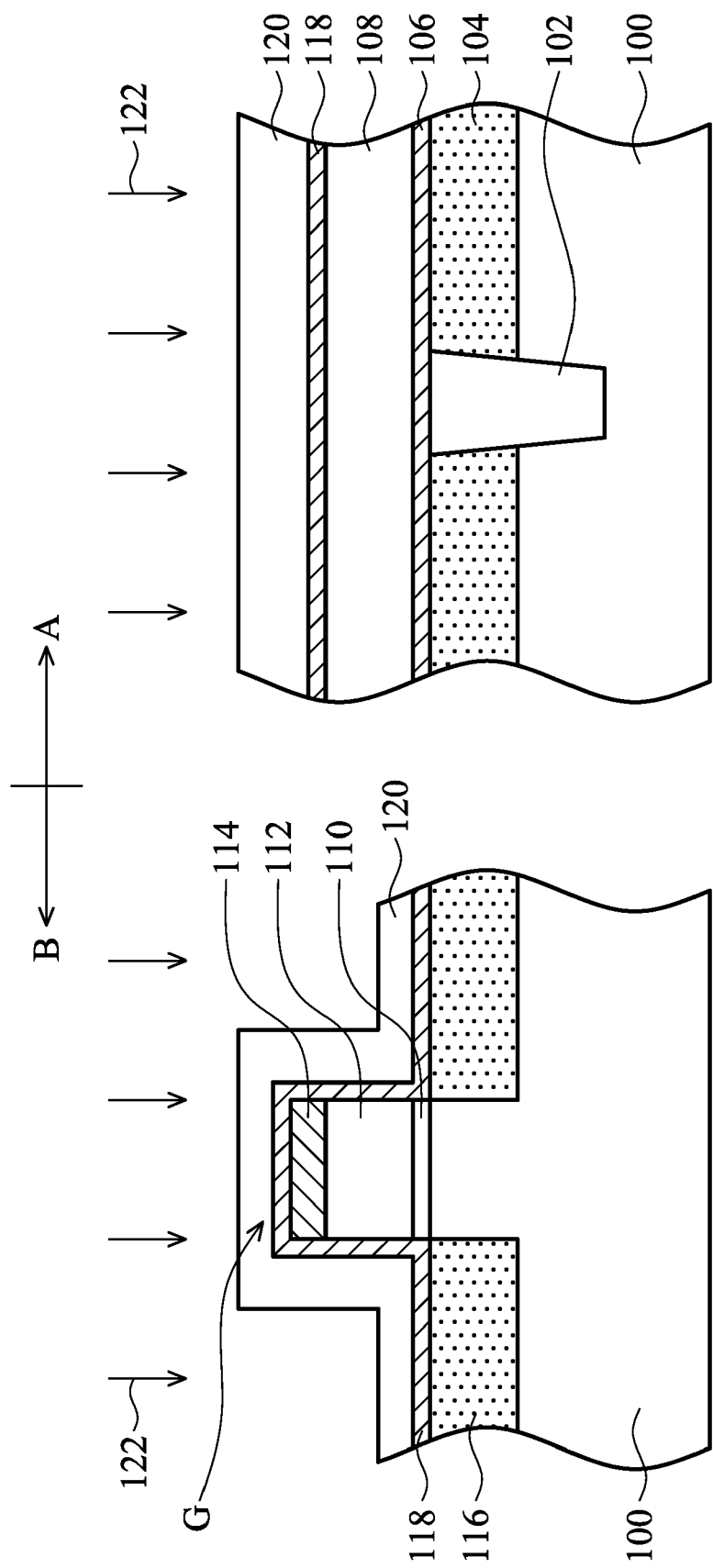

In FIG. 2, a dielectric layer 118 of a thickness of about 50-200 Å and a dielectric layer 120 of a thickness of about 100-300 Å are sequentially formed over the semiconductor substrate 100 to conformably cover the gate structure G in the region B and a top surface of the dielectric layer 108 in the region A. In one embodiment, the dielectric layer 118 may comprise silicon nitride and the dielectric layer 120 may comprise silicon oxide. Next, an etching process 122 such as a dry etching process is performed to etch back the dielectric layers 120 and 118, thereby forming a composite spacer 124 on opposite sidewalls of the gate structure G in the region B and entirely removing the dielectric layers 120 and 118 in the regions A, as shown in FIG. 3.

Figure 3:
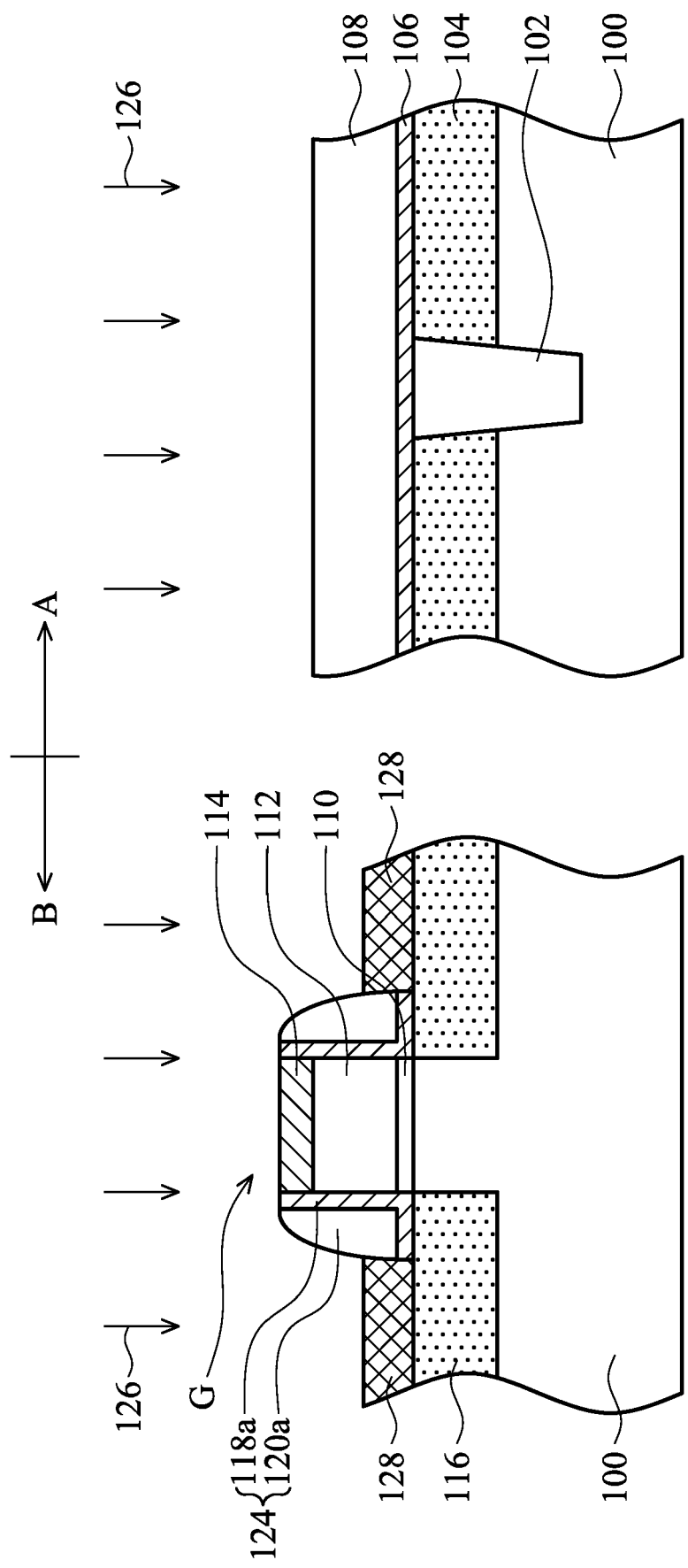

In FIG. 3, each of the composite spacers 124 comprises the patterned dielectric layers 118a and 120a and partially covers a portion of the conductive regions 116 adjacent to the gate structure G. Next, an epitaxy process 126 is performed to form a conductive semiconductor layer 128 on the conductive regions 116 in the region B. During the epitaxy process 126, the top surface of the semiconductor substrate 100 in the region A is covered by the dielectric layers 106 and 108 such that the conductive semiconductor layer 128 will not be formed over the semiconductor substrate 100 in the region A. The epitaxy process 126 can be, for example, a chemical vapor deposition (CVD) method performed under a temperature of about 850° C., using $SiH_2Cl_2$, HCl and $H_2$ as reacting gases. In the epitaxy process 126, the formed conductive semiconductor materials may comprise semiconductor materials such as silicon in-situ doped with conductive dopants such as arsenic (As) and phosphorus (P) or other elements. The conductive semiconductor layer 128 formed over the exposed surface of the conductive regions 116 adjacent to the gate structure G may function as a raised source/drain region for improving device performance of a transistor comprised thereof.

In FIG. 4, a deposition process 130 such as a spin-on process is performed to blanketly form a dielectric layer 132 over the semiconductor substrate 100 in the regions A and B, covering the gate structure G, the composite spacers 124, and the conductive semiconductor layer 128. The dielectric layer 132 can be, for example, spin-on dielectric materials such as polysilazane such that the dielectric layer 132 can be formed with a planar top surface after formation thereof.

In FIG. 5, an etching process 134 is performed to form an opening 132 through the dielectric layers 132, 108 and 106 in the region A. The opening 132 exposes a top surface of the isolation element 102 and portions of a top surface of the conductive regions 104 adjacent to the isolation element 102. Herein, the opening 136 functions as a contact hole and is formed with an aspect ratio (H:W) of, for example, 1:1-5:1. Next, a conductive material such as metal or doped polysilicon is deposited over the dielectric layer 132 and entirely fills the opening 136, and a portion of the conductive material above a top surface of the dielectric layer 132 is then removed by a planarization process (not shown) such as a chemical mechanical polishing (CMP) process, thereby leaving a conductive contact 138 in the opening 136 to physically and electrically connect the conductive regions 104 with conductive element (not shown) which is later formed thereover, for example, a conductive wire, formed over the dielectric layer 132. FIG. 6 shows a top view of the structure shown in FIG. 5, and the structure shown in FIG. 5 shows a cross section taken along the line 5-5 of FIG. 6.

However, as shown in the exemplary structure as illustrated in FIGS. 5-6, since the dimension such as a width or a diameter W of the opening 136 will be further decreased with shrinkage of the semiconductor device comprising the exemplary structure as illustrated in FIGS. 5-6, the aspect ratio of the opening 136 will further increase such that it becomes problematic to fill the conductive material of the conductive contact 138 in the opening 136. Thus, voids or seams may be formed in the conductive contact 138, thereby causing an open circuit between the conductive regions 104 and conductive elements (not shown) which are later formed thereover. In addition, a hetero-junction between the conductive regions 104 and the conductive contact 138 is small since the conductive contact 138 only partially covers a portion of a top surface thereof. Thus, the contact resistance of the conductive contact 138 is increased as a surface area of the heterojunction between the conductive regions 104 and the conductive contact 138 is reduced.

Thus, an improved method for fabricating a conductive contact to address the above issues is needed. FIGS. 7-12 are schematic diagrams showing an exemplary method for fabricating a conductive contact mitigating the above issues, wherein FIGS. 7-11 show schematic cross sections and FIG. 12 shows a schematic top view of the exemplary method.

Figure 7:
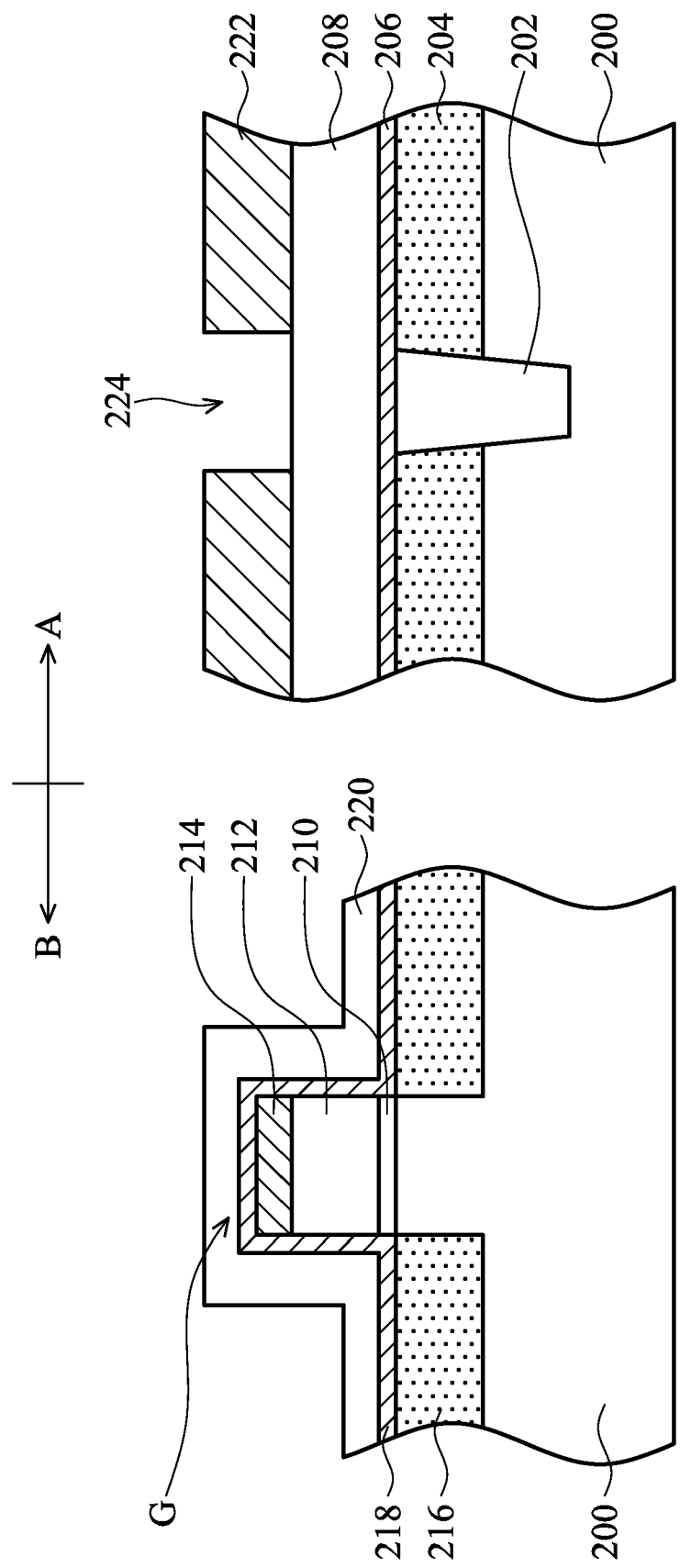
FIGS. 7-12 are schematic diagrams showing a method for fabricating a conductive contact according to another embodiment of the invention.

In FIG. 7, a semiconductor substrate 200 such as a p-type silicon substrate is first provided. As shown in FIG. 7, two individual regions A and B are defined over the semiconductor substrate 200 for accommodating various devices (not shown). In one embodiment, the region A may function as an array region for accommodating memory cells of a memory device (not shown) and the region B may function as a periphery region for accommodating periphery circuits of a memory device (not shown). The semiconductor substrate 200 in the region A is provided with a plurality of conductive regions 204, an isolation element 202 therein, and two dielectric layers 206 and 208 sequentially formed thereover. The semiconductor substrate 200 in the region B is provided with a gate structure G formed thereover and two conductive regions 216 formed in the semiconductor substrate 200 which is respectively adjacent to opposite sides of the gate structure G. In one embodiment, the isolation element 202 in the region A is a shallow trench isolation (STI) but is not limited thereto. The isolation element 202 isolates the conductive regions 204 from each other. In one embodiment, the conductive regions 204 can be, for example, n-type doped regions which may both function as source or drain regions of a transistor (not shown) for a memory cell of a memory device such as a dynamic random access memory (DRAM) device. The dielectric layer 206 may comprise silicon oxide and has a thickness of about 1000-2000 Å, and the dielectric layer 208 may comprise silicon nitride and has a thickness of about 100-500 Å. The gate structure G may comprise a gate dielectric layer 210, a gate electrode 212, and a mask layer 214 sequentially formed over the semiconductor substrate 200, and the conductive regions 216 formed in the semiconductor substrate 200 in the region B can be, for example, n-type doped regions which may function as source or drain regions. In one embodiment, the gate dielectric layer 210 may comprise silicon oxide or high-k dielectrics, the gate electrode 212 may comprise doped polysilicon, metal, or combinations thereof, and the mask layer may comprise silicon nitride. Next, a dielectric layer 218 of a thickness of about 50-200 Å and a dielectric layer 220 of a thickness of about 100-300 Å are sequentially formed over the semiconductor substrate 200 only in the region B to conformably cover the gate structure G and the semiconductor substrate 200 in the region B. In one embodiment, the dielectric layer 218 may comprise silicon nitride and the dielectric layer 220 may comprise silicon oxide. Next, a pattern mask layer 222 with an opening 224 therein is formed over the semiconductor substrate 200 only in the region A, and the opening 224 is substantially located over the isolation element 202 and exposes a portion of the dielectric layers 208 and 206 formed over the isolation element 202.

Figure 8:
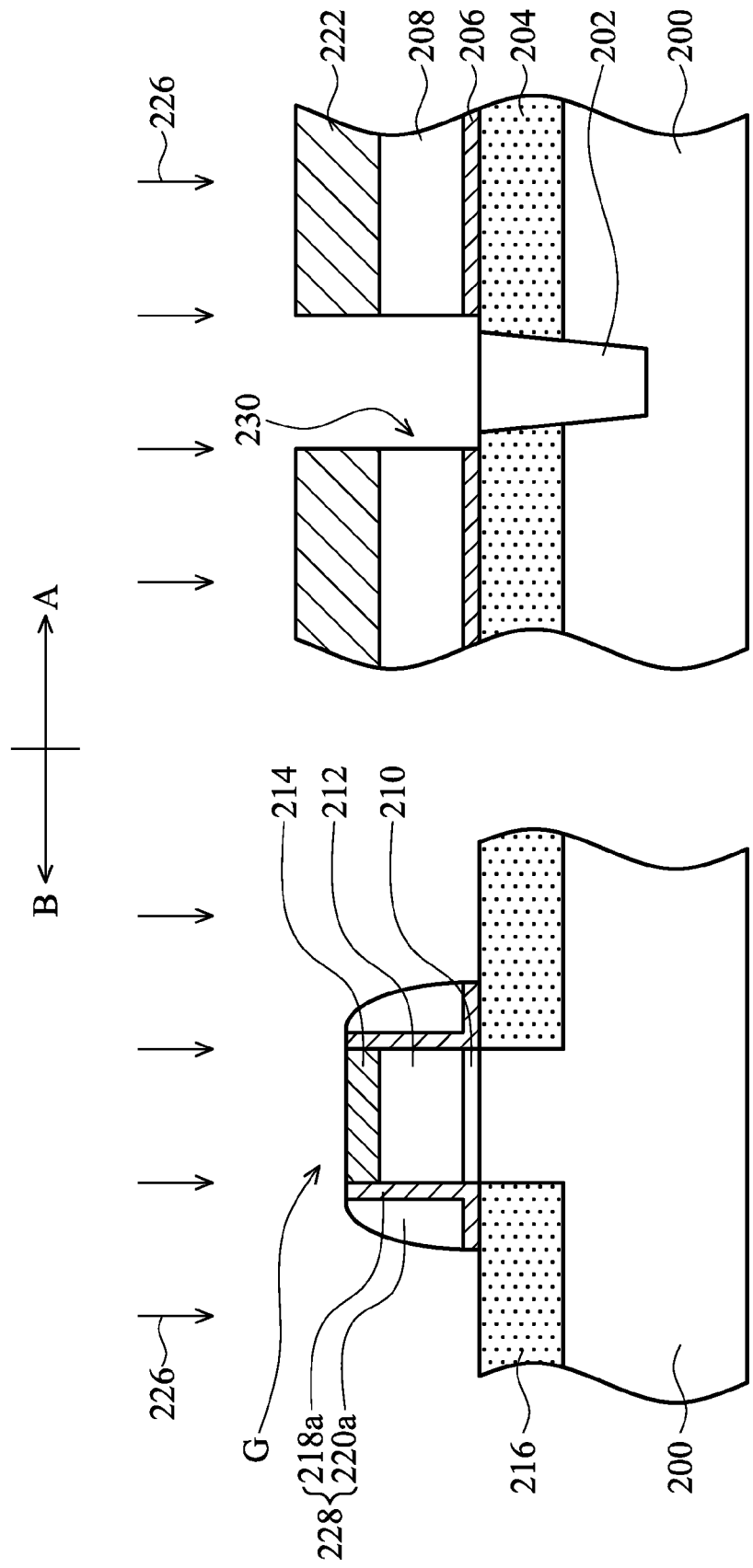

In FIG. 8, an etching process 226 such as a dry etching process is performed to etch back the dielectric layers 220 and 218 in the region B and etch through the dielectric layers 208 and 206 in the region A, thereby forming a composite spacer 228 on opposite sidewalls of the gate structure G in the region B and forming an opening 230 in the dielectric layers 220 and 218 in the region A. The opening 230 exposes a top surface of the isolation element 202 and portions of a top surface of the conductive regions 204 adjacent to the isolation element 202. As shown in FIG. 8, each of the composite spacers 228 comprises the patterned dielectric layers 218a and 220a and partially covers a portion of the conductive regions 216 adjacent to the gate structure G.

Figure 9:
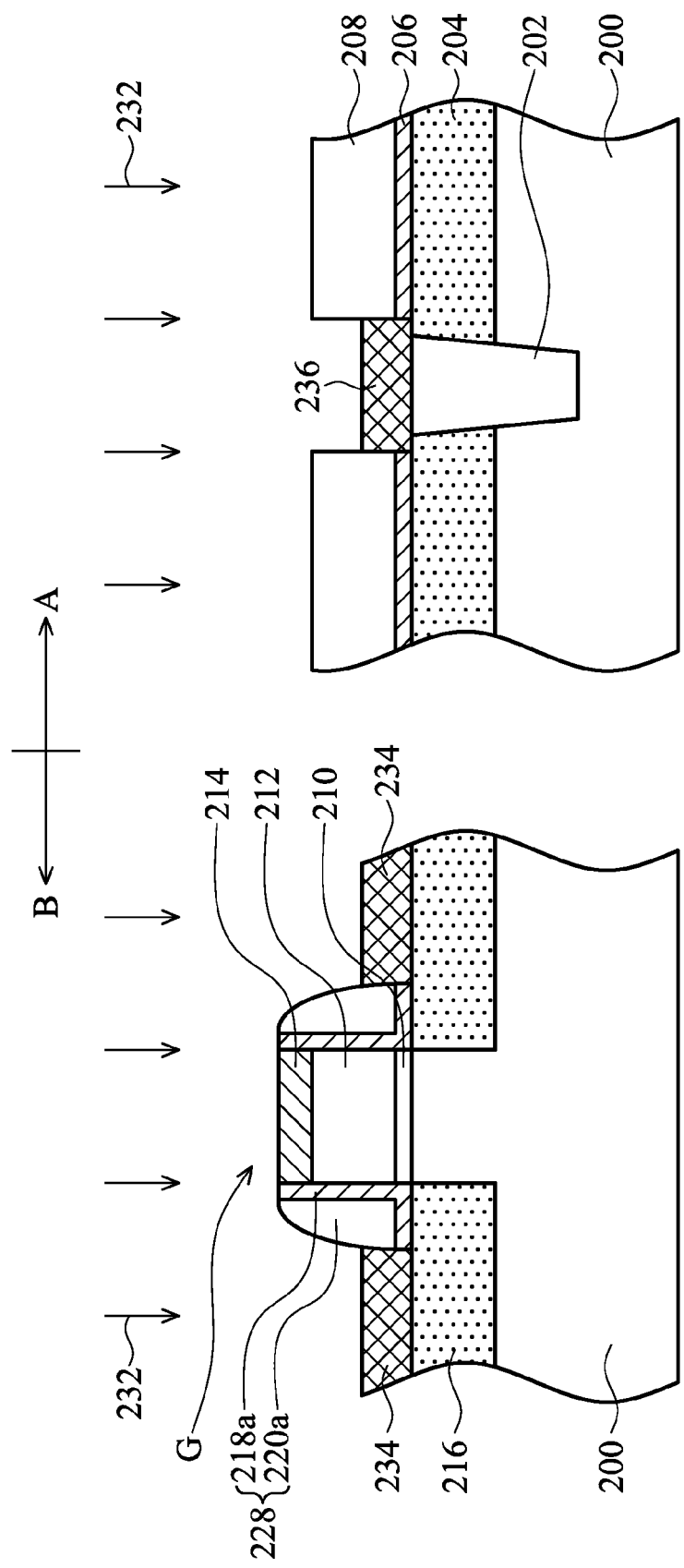

In FIG. 9, the patterned mask layer 222 formed in the region A is first removed and an epitaxy process 232 is performed to form a conductive semiconductor layer 234 on the conductive regions 216 in the region B and a conductive semiconductor layer 236 on the top surfaces of the isolation element 202 and portions of the conductive region 204 adjacent to the isolation element 202. The epitaxy process 232 can be, for example, a chemical vapor deposition (CVD) method performed under a temperature of about 850° C., using $SiH_2Cl_2$, HCl and $H_2$ as reacting gases. In the epitaxy process 232, the formed semiconductor material of the conductive semiconductor layers 234 and 236 may comprise semiconductor materials such as silicon in-situ doped with conductive dopants such as arsenic (As), phosphorus (P) or other elements. The conductive semiconductor layer 234 formed over the exposed surface of the conductive regions 216 adjacent to the gate structure G may have a thickness of about 100-400 Å, functioning as a raised source/drain region for improving device performance of a transistor comprised thereof. The conductive semiconductor layer 236 formed on the top surfaces of the isolation element 202 and portions of the conductive region 204 adjacent to the isolation element 202 may have a thickness of about 100-400 Å and functions as a portion of a conductive contact to reduce a contact resistance thereof.

Figure 10:
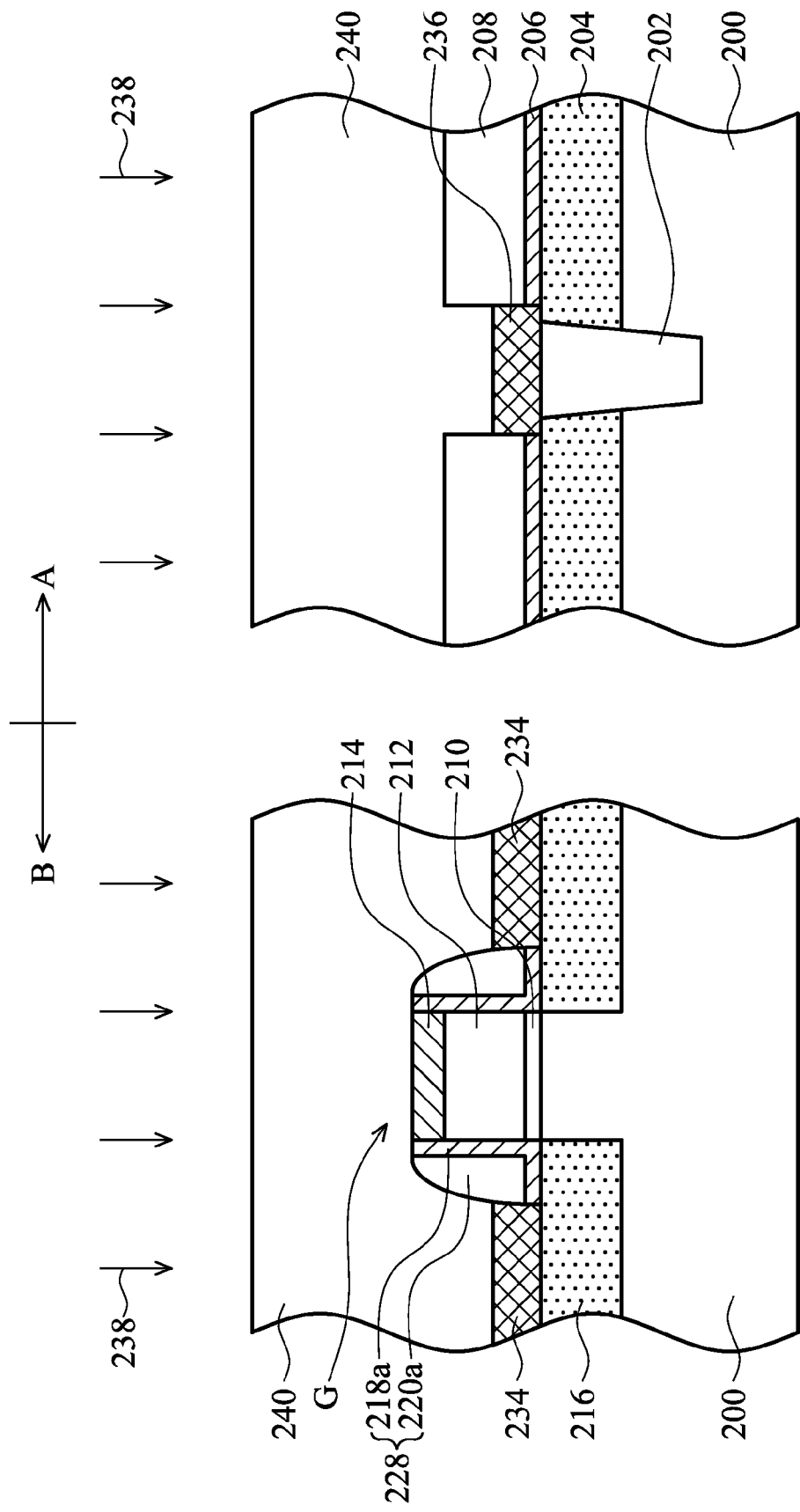

In FIG. 10, a deposition process 238 such as a spin-on process is performed to blanketly form a dielectric layer 240 over the semiconductor substrate 200 in the regions A and B, covering the gate structure G, the composite spacers 228, the dielectric layer 208, and the conductive semiconductor layers 234 and 236. The dielectric layer 240 can be, for example, spin-on dielectric materials such as polysilazane such that the dielectric layer 240 can be formed with a planar top surface after formation thereof.

Figure 11:
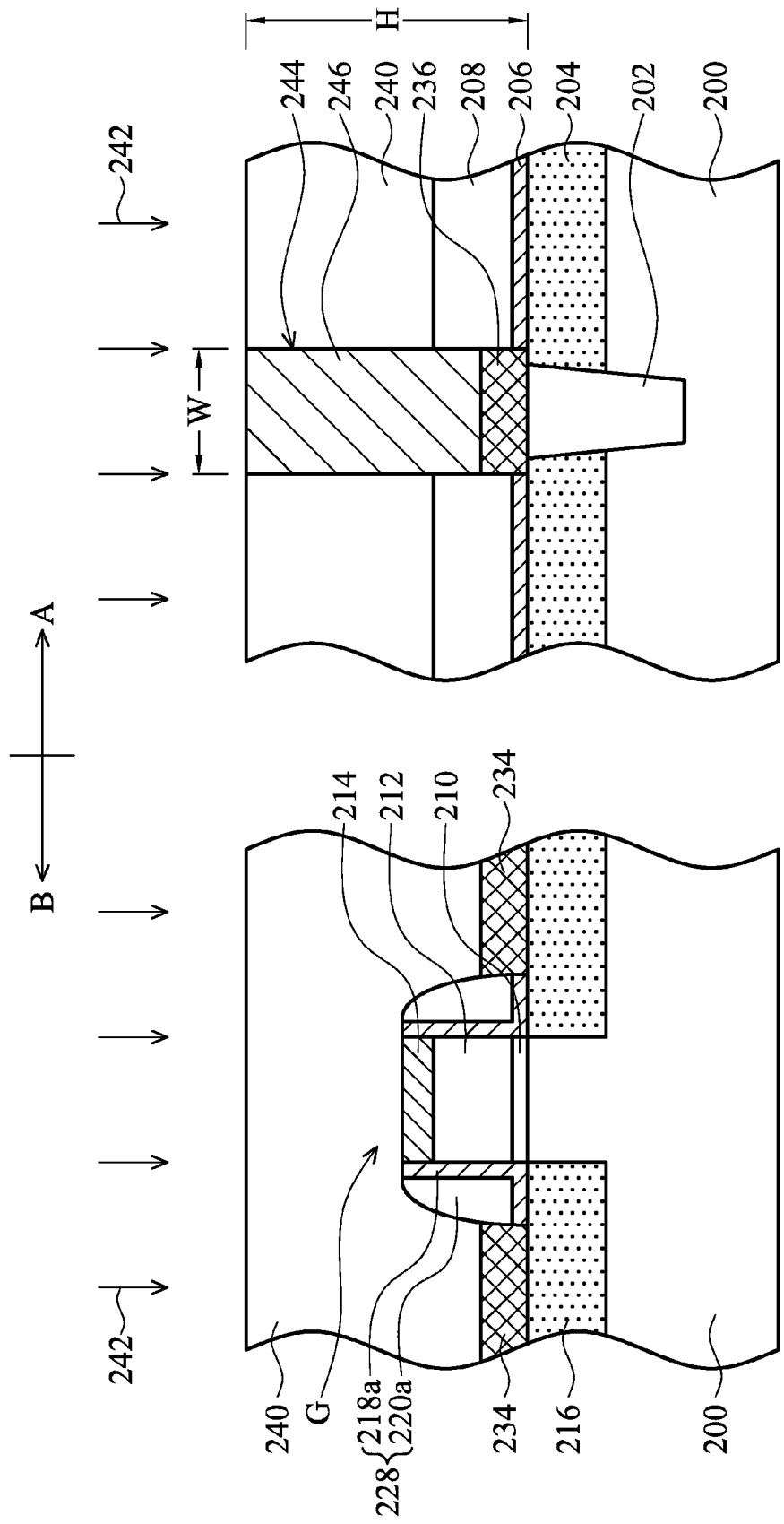
Figure 12:
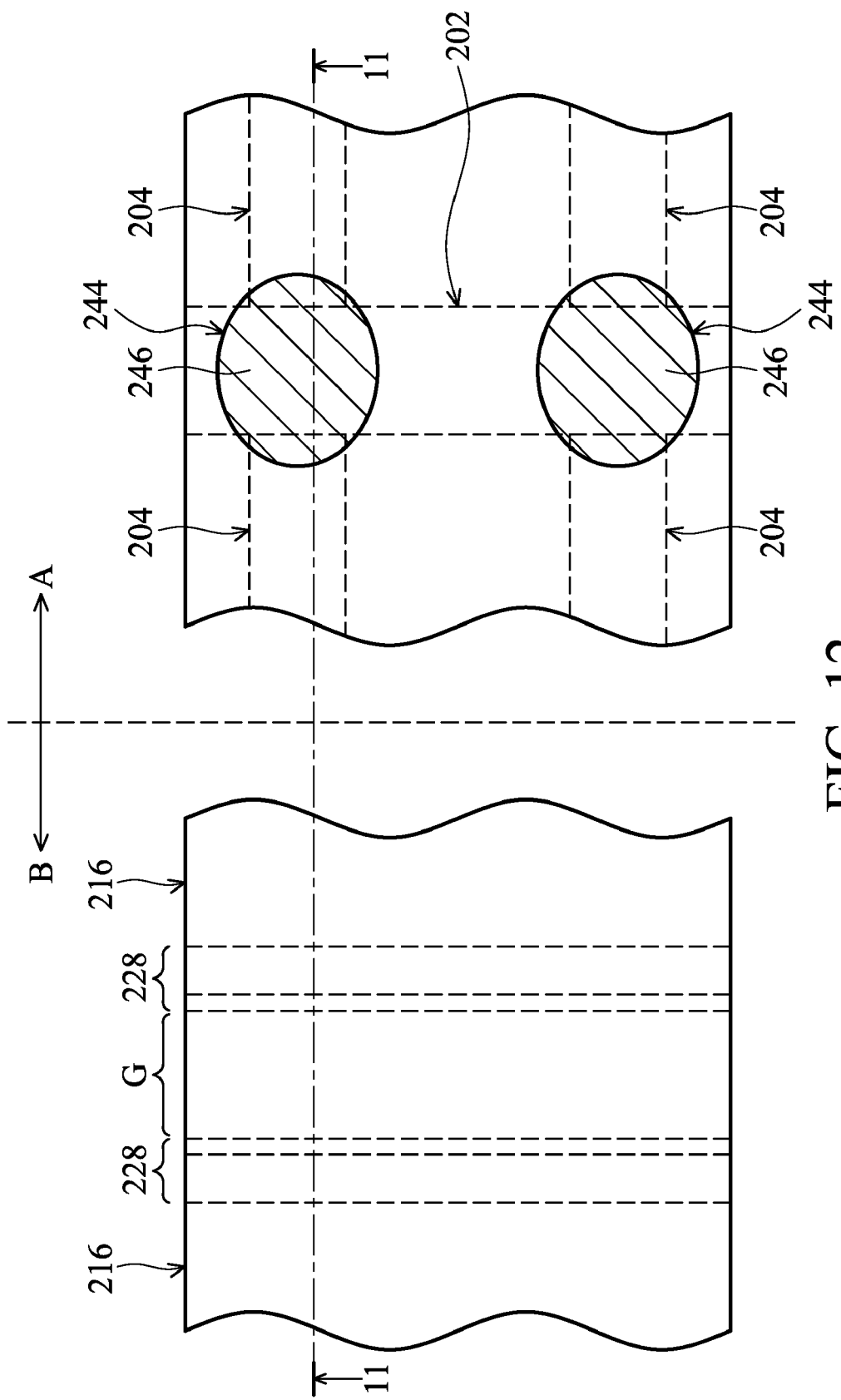

In FIG. 11, an etching process 242 is performed to form an opening 244 through the dielectric layer 240 in the region A, and the opening 240 again expose a top surface of the conductive semiconductor layer 236 formed over portions of the top surface of the conductive regions 204 adjacent to the isolation element 202. Herein, the opening 244 functions as a contact hole and is formed with an aspect ratio (H:W) of, for example, 1:1-4:1, which is reduced when compared with the aspect ratio of the contact hole 136 shown in FIG. 5. Next, a conductive material such as metal or doped polysilicon is then deposited over the dielectric layer 240 and entirely fills the opening 244, and a portion of the conductive material above a top surface of the dielectric layer 240 is then removed by a planarization process (not shown) such as a chemical mechanical polishing (CMP) process, thereby leaving a conductive layer 246 in the opening 244. A combination of the conductive layer 246 and the conductive semiconductor layer 236 functions as a conductive contact for physically and electrically connect the conductive regions 204 with conductive element (not shown) which is later formed thereover, for example, a conductive wire, formed over the dielectric layer 240. FIG. 12 shows a top view of the structure shown in FIG. 11, and the structure shown in FIG. 11 shows a cross section taken along a line 11-11 in FIG. 12.

In the exemplary structure as disclosed in FIGS. 11-12, due to formation of the conductive semiconductor layer 236 formed during formation of the conductive semiconductor layers 238 in the region B, the aspect ratio of the opening 244 can be decreased such that the conductive material of the conductive layer 246 is ensured to entirely be filled into the opening 244. This is advantageous when a dimension such as a width or a diameter W of the opening 244 is further decreased with the shrinkage of a semiconductor device having the opening 244. Thus, no voids or seams will be formed in the conductive contact and the open circuit issue between the conductive regions 204 and conductive elements (not shown) which are later formed thereover, will not occur. In addition, a homo-junction is formed between the conductive semiconductor layer 236 and the conductive regions 204, and the conductive layer 246 and the conductive semiconductor layer 236 have a hetero-junction therebetween which is much greater than the hetero-junction formed between the conductive contact 138 and the conductive regions 104 as shown in FIG. 5, such that a contact resistance of the conductive contact comprising the conductive layer 246 and the conductive semiconductor layer 236 is reduced, despite shrinkage of the semiconductor device having the conductive contact. Moreover, since the conductive semiconductor layer 236 of the conductive contact can be simultaneously formed during the epitaxy process for forming the conductive semiconductor layers 234 in the region B, thermal budget for forming the conductive regions 204 formed in the region A and the conductive regions 216 formed in the region B can be precisely controlled.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a conductive contact, comprising:
   providing a semiconductor substrate with a gate structure formed thereover and a pair of first conductive regions formed therein in a first region thereof, and a pair of second conductive regions and an isolation element formed therein, and a first dielectric layer and a second dielectric layer thereon in a second region thereof, wherein the pair of first conductive regions are formed in the semiconductor substrate from opposite sides of the gate structure and the isolation element isolates the pair of the second conductive regions from each other;
   conformably and sequentially forming a third dielectric layer and a fourth dielectric layer over the semiconductor substrate in the first region;

forming a pattern mask layer with a first opening therein over the second dielectric layer in the second region, wherein the first opening is substantially located over the isolation element;

performing an etching process to etch back the third and fourth dielectric layers in the first region and a portion of the first and second dielectric layers in the second region exposed by the first opening in the patterned mask layer, thereby forming a composite spacer on opposite sidewalls of the gate structure in the first region and a second opening in the first and second dielectric layers in the second region, wherein the second opening formed in the first and second dielectric layers exposes a portion of a top surface of the isolation element and portions of a top surface of the pair of second conductive regions;

removing the patterned mask layer;

performing an epitaxy process and forming a first conductive semiconductor layer over the pair of the first conductive regions and a second conductive semiconductor layer over the top surface of the isolation element and portions of the top surface of the pair of second conductive regions exposed by the second opening;

blanketly forming a fifth dielectric layer over the semiconductor substrate in the first and second regions;

forming a third opening in the fifth dielectric layer in the second region, exposing a top surface of the second conductive semiconductor layer; and forming a conductive layer in the third opening, overlying the second conductive semiconductor layer and filling the third opening.

2. The method as claimed in claim 1, wherein the isolation element is a shallow trench isolation element.

3. The method as claimed in claim 1, wherein the semiconductor substrate is a p-type substrate and the pair of first and second conductive regions are n-type regions.

4. The method as claimed in claim 1, wherein the third opening has an aspect ratio of about 1:1-4:1.

5. The method as claimed in claim 1, wherein the epitaxy process is performed under a temperature of about 850° C., using $SiH_2Cl_2$, HCl and $H_2$ as reaction gases.

6. The method as claimed in claim 5, wherein the first and second conductive semiconductor layers are in-situ doped with conductive dopants during the epitaxy process.

7. The method as claimed in claim 1, wherein the first and second conductive semiconductor layer comprise silicon doped with arsenic or phosphorus.

8. The method as claimed in claim 1, wherein the conductive layer comprises metal or doped polysilicon.

9. The method as claimed in claim 1, wherein the pair of the second conductive regions are both source or drain regions for a transistor.

10. The method as claimed in claim 1, wherein the epitaxy process is performed by a chemical vapor deposition method.

* * * * *